US011133124B2

(12) United States Patent
Inkinen et al.

(10) Patent No.: US 11,133,124 B2
(45) Date of Patent: Sep. 28, 2021

(54) APPARATUS FOR MAGNETICALLY ATTACHING TO LOAD

(71) Applicant: Tarkmet Oy, Vaasa (FI)

(72) Inventors: Mika Inkinen, Lempäälä (FI); Henri Troberg, Tampere (FI)

(73) Assignee: Tarkmet Oy, Vaasa (FI)

( * ) Notice: Subject to any disclaimer, the term of this patent is extended or adjusted under 35 U.S.C. 154(b) by 73 days.

(21) Appl. No.: 16/721,979

(22) Filed: Dec. 20, 2019

(65) Prior Publication Data

US 2020/0203050 A1    Jun. 25, 2020

(30) Foreign Application Priority Data

Dec. 21, 2018 (FI) .................................. 20186134

(51) Int. Cl.
| H01F 7/20 | (2006.01) |
| G01G 23/18 | (2006.01) |
| G01R 19/00 | (2006.01) |
| H01F 7/06 | (2006.01) |

(52) U.S. Cl.
CPC ............. *H01F 7/206* (2013.01); *G01G 23/18* (2013.01); *G01R 19/0092* (2013.01); *H01F 7/064* (2013.01)

(58) Field of Classification Search
CPC ......... H01F 7/206; H01F 7/064; G01G 23/18; G01R 19/0092
USPC ...................................................... 361/144
See application file for complete search history.

(56) References Cited

U.S. PATENT DOCUMENTS

| 5,998,944 A | * | 12/1999 | Clutter | ..................... B66C 1/08 |
| | | | | 318/141 |
| 2008/0121048 A1 | * | 5/2008 | Burkhard | ............. G01G 21/244 |
| | | | | 73/862.68 |
| 2008/0191504 A1 | * | 8/2008 | Pollock | ................... B66C 13/16 |
| | | | | 294/65.5 |

FOREIGN PATENT DOCUMENTS

| JP | S53147358 A | 12/1978 |
| JP | 2005247543 A | 9/2005 |
| JP | 2014001040 A | 1/2014 |
| WO | WO9703912 A1 | 2/1997 |

\* cited by examiner

*Primary Examiner* — Thienvu V Tran
*Assistant Examiner* — Sreeya Sreevatsa
(74) *Attorney, Agent, or Firm* — Laine IP Oy

(57) ABSTRACT

According to an example aspect of the present invention, there is provided an apparatus for magnetically attaching to a load comprising: a direct current power source; an electromagnet comprising a coil connectable to the direct current power source for feeding current to the coil for attaching to a load by a magnetic force; a current measurement device connected to the coil; a user interface for displaying information indicating a load capacity of the apparatus; and a controller operatively connected to the direct current power source, the coil, the current measurement device and the user interface to cause: connecting the direct current power source to the coil; measuring current of the coil; determining a rise time of the current to a nominal value of current of the coil, when the load is attached to the apparatus; determining a load capacity and/or usage level of the load capacity of the apparatus based on the rise time of the current to the nominal value; and displaying the load capacity on the user interface.

15 Claims, 7 Drawing Sheets

APPARATUS FOR MAGNETICALLY ATTACHING TO LOAD

FIELD

The present invention relates to an apparatus for magnetically attaching to a load.

BACKGROUND

Magnetic forces provide attaching to various objects, i.e. loads. A magnetic force may be utilized for attaching to objects at least in lifting devices and machine tools. Maintaining the attachment by magnetic forces to the objects is needed in various applications such that risks of unintentional detachment of the objects can be reduced to provide safety in use of the lifting devices, machine tools and other application areas of magnetic attachment.

Magnetic lifters are attached by a magnetic force to a load. A sufficient load capacity for attaching the load to a magnetic lifting device depends on the weight of the load. One way to provide a sufficient load capacity for lifting a load by a magnetic lifting device is to add a safety margin to a measured or estimated weight of the load. A load capacity determined in such a way applies to most lifting situations. However, in situations, where magnetic forces acting to lifted loads may vary considerably, such as when different types of load are handled and/or debris can prevent a good contact between the load and the magnetic lifting device, the safety margin may be insufficient for providing a safe attachment to the load.

SUMMARY OF THE INVENTION

The invention is defined by the features of the independent claims. Some specific embodiments are defined in the dependent claims.

According to a first aspect of the present invention, there is provided an apparatus for magnetically attaching to a load, the apparatus comprising: a direct current power source; an electromagnet comprising a coil connectable to the direct current power source for feeding current to the coil for attaching to the load by a magnetic force; a current measurement device connected to the coil; a user interface for displaying information indicating a load capacity of the apparatus; and a controller operatively connected to the direct current power source, the coil, the current measurement device and the user interface to cause: connecting the direct current power source to the coil; measuring current of the coil; determining a rise time of the current to a nominal value of current of the coil, when the load is attached to the apparatus; determining a load capacity of the apparatus based on the rise time of the current to the nominal value; and displaying the load capacity and/or a usage level of the load capacity on the user interface.

According to a second aspect of the present invention, there is provided a method for an apparatus for magnetically attaching to a load comprising: a direct current power source; an electromagnet comprising a coil connectable to the direct current power source for feeding current to the coil for attaching to a load by a magnetic force; and a current measurement device connected to the coil; a user interface for displaying information indicating a load capacity of the apparatus, the method comprising: connecting the direct current power source to the coil; measuring current of the coil; determining a rise time of the current to a nominal value of current of the coil, when the load is attached to the apparatus; determining a load capacity of the apparatus based on the rise time of the current to the nominal value; and displaying the load capacity and/or a usage level of the load capacity on the user interface.

According to a third aspect of the present invention, there is provided a computer program configured to cause a method in accordance with an aspect to be performed, when the computer program is executed by a controller operatively connected to the direct current power source, the coil, the current measurement device and the user interface.

According to a fourth aspect of the present invention, there is provided a non-transitory computer readable medium having stored thereon a set of computer readable instructions that, when executed by at least one processor, cause an apparatus to at least to perform a method according to an aspect.

According to a fifth aspect there is provided an apparatus for magnetically attaching to a load comprising: means for connecting a direct current power source to a coil in an electromagnet; means for measuring current of the coil; means for determining a rise time of the current to a nominal value of current of the coil, when a load is attached to the magnetic lifting device; means for determining a load capacity of the magnetic lifting device based on the rise time of the current to the nominal value; and means for displaying the load capacity and/or a usage level of the load capacity on an user interface.

EMBODIMENTS

Figure 1:
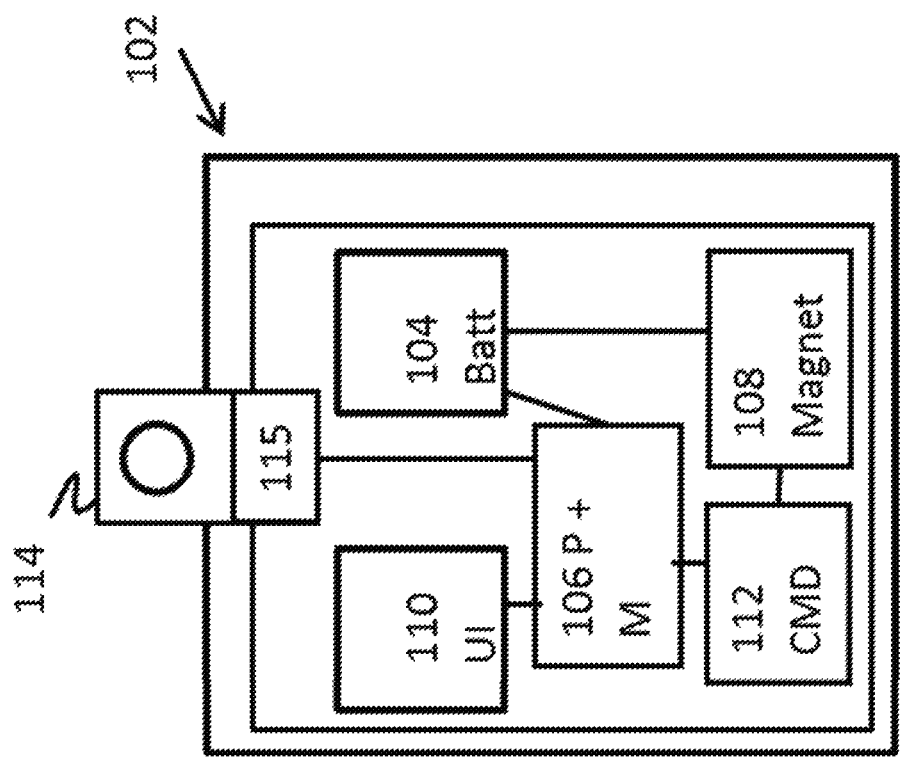
FIG. 1 illustrates an apparatus for magnetically attaching to a load in accordance with at least some embodiments of the present invention.

In connection with apparatus for attaching to a load by a force caused by a magnetic field, there is provided an apparatus for magnetically attaching to the load that facilitates safely attaching to different types of magnetic material. The apparatus comprises a direct current power source, an electromagnet comprising a coil connectable to the direct current power source for feeding current to the coil for attaching to a load by a magnetic force, a current measurement device (CMD) connected to the coil, and a user interface (UI) for displaying information indicating a load capacity and/or a usage level of the load capacity of the apparatus. A controller is operatively connected to the direct current power source, the coil, the current measurement device and the user interface to cause connecting the direct current power source to the coil; measuring current of the coil; determining a rise time of the current to a nominal value of current of the coil, when the load is attached to the apparatus; determining a load capacity of the apparatus based on the rise time of the current to the nominal value; and displaying the load capacity on the user interface. Therefore, the rise time of the current depends on the load that is being lifted, whereby the load capacity displayed to the user can be determined specific to the load that is currently lifted and safety of each lift may be provided particularly in situations, where magnetic forces acting to lifted loads may vary considerably, such as when different types of load are handled and/or debris can prevent a good contact between the load and the apparatus.

It should be appreciated that the rise time of the current depends on the inductance of the electromagnet. The inductance of the electromagnet is dependent on the coil core. The load that is attached by the apparatus becomes a part of the coil core. The thicker the load is, the higher the inductance and thereby the rise time will be.

Current value rises very fast to the coil specific nominal value without metal object. When a metal object becomes part of electromagnet core, it increases the inductance. Increased inductance enables more energy to be stored to magnetic field and it takes more time to store the energy. When metal object is very thick and only material permeability restricts the field strength, maximum lifting capability reached after maximum energy is stored to electromagnet.

According to at least one embodiment, an apparatus for magnetically attaching to a load may be a magnetic lifting device, referred to a magnetic lifter, that is capable of generating a magnetic field. The magnetic field may be generated by the magnetic lifting device, when the magnetic lifting device is brought into contact with the load, whereby the load may be magnetized by the magnetic field. When the load is magnetized the, the load is attached by the magnetic field to the magnetic lifter and the load can be lifted with the magnetic lifter. Examples of the load comprise materials that have a positive magnetic susceptibility for example paramagnetic materials and ferromagnetic materials. The load may in a shape of plates, sheets, beams or containers. It should be appreciated that the load may also be in other forms.

In the present context a load capacity may refer to a weight of load that an apparatus, e.g. a magnetic lifting device, may be attached magnetically and keeping the load safely attached to the apparatus. The magnetic lifting device may be maintained attached to a load at least, when the load is being moved.

It should be appreciated that magnetic force may be utilized in various context and applications, for attaching an object, i.e. a load, to an apparatus. Examples of apparatuses utilizing magnetic force for attaching to loads comprise at least magnetic lifting devices, machine tools, magnetic workholding systems, magnetic chucks, magnetic vises and magnetic workholding tables. Accordingly, in various contexts and applications a magnetic force may be caused to a load for attaching to the load. The magnetic force may be referred to an attaching force, a lifting force, friction force and/or a holding force, without limiting thereto. However, in the following the embodiments will be described in the context of magnetic lifting devices without limiting thereto.

FIG. 1 illustrates a magnetic lifting device in accordance with at least some embodiments of the present invention. The magnetic lifting device 102 comprises a direct current power source 104, an electromagnet comprising a coil 108 connectable to the direct current power source for feeding current to the coil for attaching to a load by a magnetic force, a current measurement device (CMD) 112 connected to the coil, and a user interface 110 for displaying information indicating a load capacity of the magnetic lifting device. A controller 106 may be operatively connected to the direct current power source 104, the coil 108, the current measurement device 112 and the user interface to cause one or more functionalities of the magnetic lifting device.

In an example the direct current power source 104 may be a battery. The direct current power source may be external or internal to the magnetic lifting device. Electrical cabling may be used to connect the direct current power source to the coil and optionally to one or more other parts of the magnetic lifting device for powering them by direct current from direct current power source. It should be appreciated that the magnetic lifting device may comprise more than one direct current power source such that different direct current power sources may be connected to power different parts of the magnetic lifting device and/or at least one of the direct current power sources may be used to backup another direct current power source.

In an example the controller may be configured to configure the coil 108 to be connected to the direct current power source 104 such that a magnetic field may be generated or disconnected from the direct current power source 104 such that the magnetic field may be turned off. The controller comprise or serve for a switching device (SWD) such that the coil 104 may be connected to the direct current power source or disconnected from the direct current power source.

The electromagnet comprises the coil 106 wound around a core such that, when the coil is connected to the direct current power source, a magnetic field is generated by the electromagnet. Strength of the magnetic field may be adjusted at least by the number of turns of the coil around the core.

In an example the user interface 110 may comprise a display device. The display device may be an output device capable presenting of information at least in visual form. Examples of display devices comprise a Cathode ray tube display (CRT), Light-emitting diode display (LED), Electroluminescent display (ELD), Electronic paper, Plasma display panel (PDP) and Liquid crystal display (LCD). It should be appreciated that the user interface may be also capable of receiving input from a user of the magnetic lifting device. The input from the user may be received by touch and/or voice. Accordingly, the user interface may comprise means for receiving input from the user. Examples of the means for receiving input from the user comprise a displayed device configured for receiving input from the user such as at least one of a touch screen and a tablet computer, buttons, keys, keyboards, computer mice, etc.

In an example the controller 106 may comprise one or more processor cores connected to memory. The processors cores may execute computer program instructions stored to the memory. Examples of the controller comprise a central processing unit (CPU) and a Microcontroller unit (MCU).

It should be appreciated that the magnetic lifting device may be connectable to be used in other devices such as cranes. For this purpose, the magnetic lifting device may comprise an attachment piece 114. The attachment piece may be engaged by a hook or other gripping means such the magnetic lifting device may be connected by the other devices such as cranes for lifting the magnetic lifting device and a load possibly attached to the magnetic lifting device.

The current measurement device 112 may be based on a shunt resistor, trace resistant sensing or Hall effect, for example. Also other types of current sensing techniques may be applied to implement the current measurement device. The current measurement device may be capable of measuring one or more electrical properties of the electrical current going through the coil. Results of the measurements may be expressed by values in Amperes or Voltages.

In some embodiments, the magnetic lifting device may comprise a scale 115. The scale may be operatively connected to the controller 106. The scale may provide measuring a weight of the load attached to the magnetic lifting device. It should be appreciated that the scale however, is not necessary for determining load capacity of the magnetic lifting device, since the load capacity is determined based on the rise time of the current to the nominal value as is described in various embodiments herein.

An embodiment concerns a computer program for use in an apparatus, for example a magnetic lifting device 102, which when executed by a controller comprised in the apparatus, causes a method in accordance with an embodiment to be performed.

It should be appreciated that a processor or a processor core connected to a memory, for example a non-transitory computer readable medium, and configured to execute a computer readable code or instructions stored to the memory may also serve for a controller in the sense of the present invention. When the computer readable code or instructions are executed by the controller, a method in accordance with an embodiment may be performed.

Connections between parts of the magnetic lifting device may be implemented by cabling capable of transferring electricity and/or data between the parts.

Figure 2A:
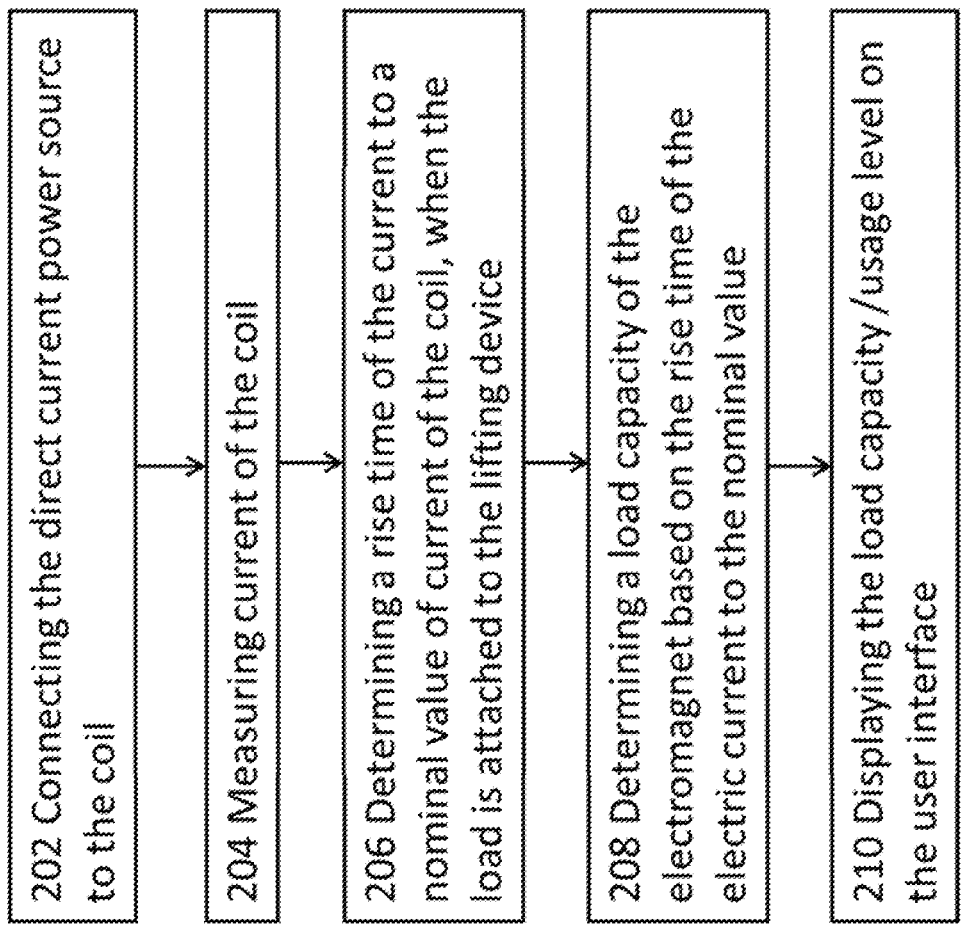
FIGS. 2A to 2C illustrate methods for an apparatus in accordance with at least some embodiments of the present invention.

FIG. 2A illustrates a method for a magnetic lifting device in accordance with at least some embodiments of the present invention. The method may be performed by the magnetic lifting device described with FIG. 1. The method of FIG. 2A comprises at least phases 202 to 210. Phase 202 comprises connecting the direct current power source to the coil. Phase 204 comprises measuring current of the coil. Phase 206 comprises determining a rise time of the current to a nominal value of current of the coil, when the load is attached to the magnetic lifting device. Phase 208 comprises determining a load capacity of the magnetic lifting device based on the rise time of the current to the nominal value. Phase 210 comprises displaying the load capacity and/or a usage level of the load capacity on the user interface. Since the rise time of the current depends on the load that is being lifted, the load capacity or the usage level displayed to the user can be adapted to different loads, such as loads having different thicknesses, whereby the user can evaluate whether the lifting is safe.

It should be appreciated that phase 208 may comprise determining the usage level of the load capacity. The usage level may be determined based on a relationship of the weight of the load and the load capacity. The weight of the load may be a value set by a user or measured by a scale of the magnetic lifting device.

In an embodiment phase 210 comprises displaying a weight of the load on the user interface. In this way the user may be informed about the weight as well as the load capacity and/or the usage level of the load capacity. In this way the user may obtain information for determining safety of the lifting. The magnetic lifting device may comprise a scale for measuring the weight of the load.

In an example, phase 202 may comprise that the direct current power source is connected to the coil, when a load is to be attached to the magnetic lifting device for moving the load. Once connected, e.g. by a controller or a switching device, to the coil, electric current is caused to the coil.

In an example, phase 204 may comprise measuring the electric current by the current measurement device.

In an example, phase 206 may comprise that the nominal value of the coil is defined based on one or more measurements of the current of the coil before the load is being attached by the magnetic lifting device. On the other hand the nominal value of the coil may be defined by specifications.

In an example, phase 208 may comprise determining the load capacity on the basis of the rise time indicating a level of magnetization of the load. The rise time and the load capacity may have a relationship that is specific to the magnetic lifting device and the type of the load. The relationship between the rise time and the load capacity of the magnetic lifting device may be determined for example by conducting a series of measurements of the rise time for different types of loads. The types of the load may vary for example in terms of material, thickness and/or shape.

Figure 2B:
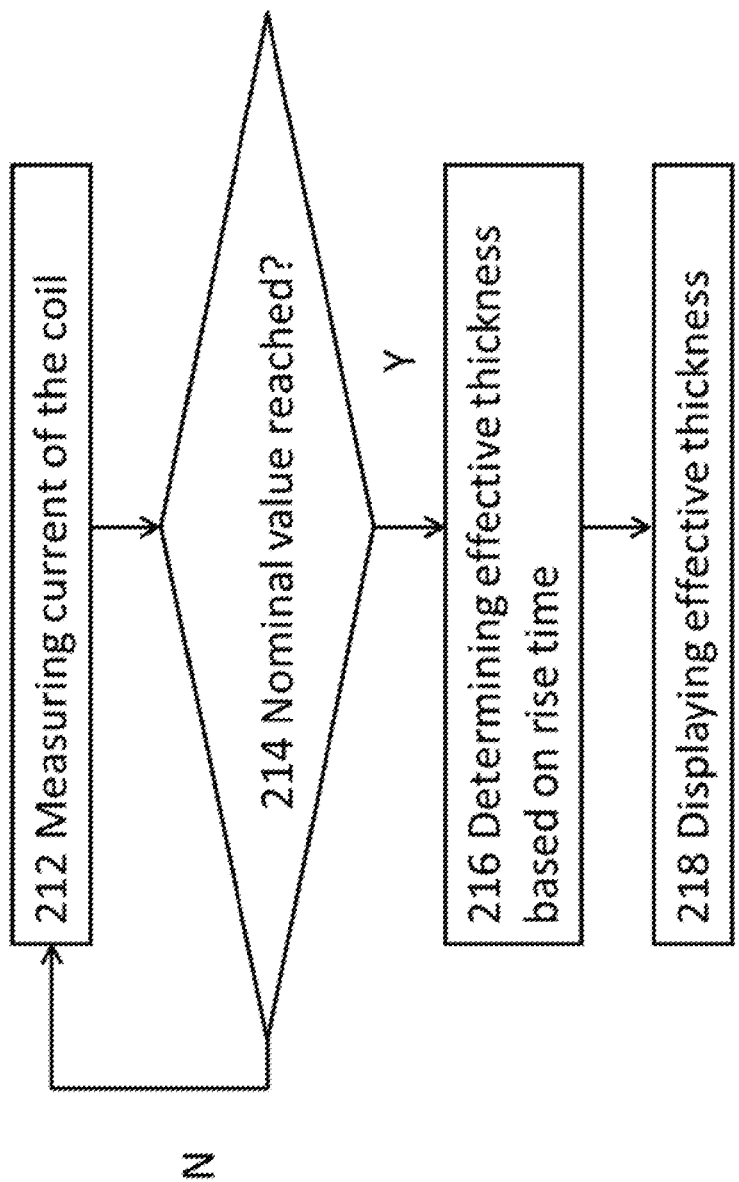
Figure 5:
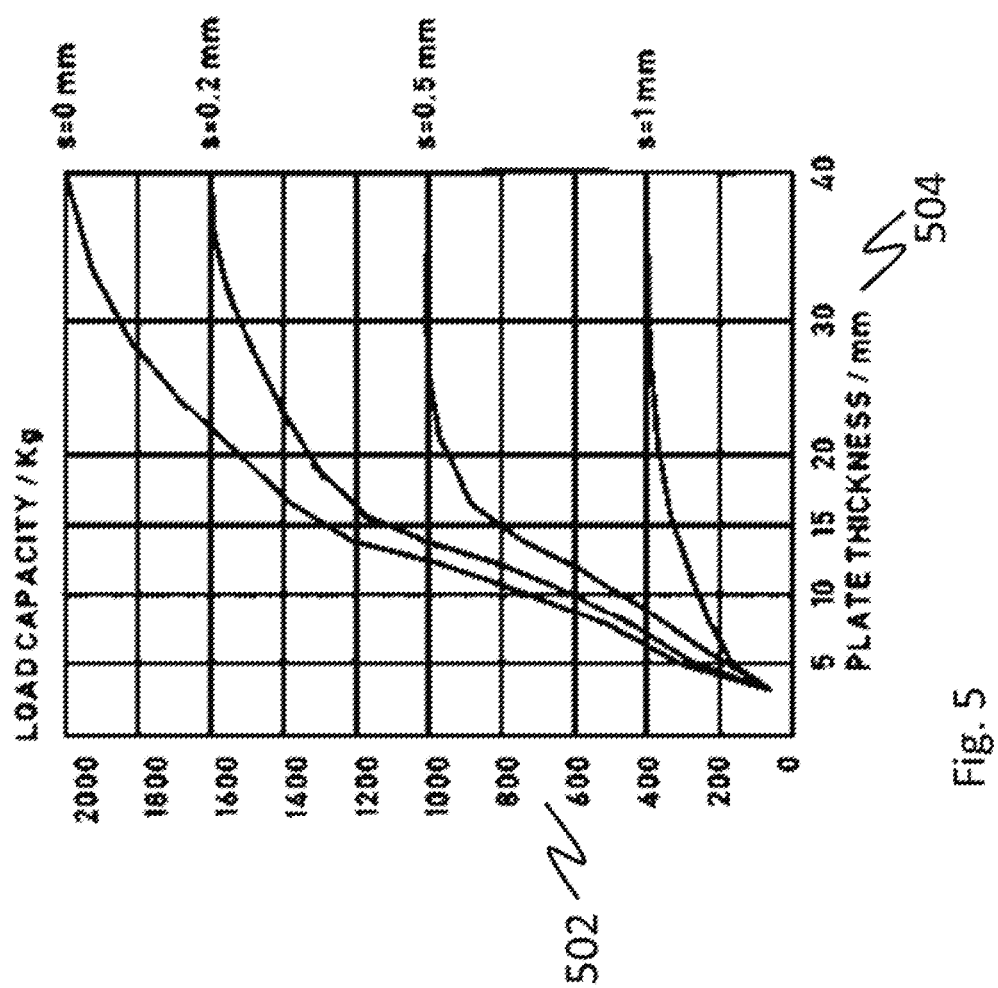
FIG. 5 illustrates a load capacity as a function of thickness in accordance with at least some embodiments of the present invention.

FIG. 2B illustrates a method for a magnetic lifting device in accordance with at least some embodiments of the present invention. The method may be performed by the magnetic lifting device described with FIG. 1. The method of FIG. 2B comprises at least phases 212 to 218. Phase 212 comprises measuring current of the coil in accordance with phase 204. Phase 214 comprises determining whether a nominal value of the current of the coil has been reached. Phase 214 may be performed in accordance with phases 204 and 206. If the nominal value has been reached phase 216 is performed. Phase 216 comprises determining an effective thickness of the load based on the rise time of the current indicating a level of magnetization of the load. The effective thickness may be a thickness corresponding to a nominal load capacity indicated by the rise time. Accordingly, the load capacity of the magnetic lifting device may be the nominal load capacity corresponding to the effective thickness of the load. The FIG. 5 illustrates an example of load capacity as a function of thickness.

Phase 218 comprises displaying the effective thickness by the user interface. In this way the user may be provided information of the effective thickness of the load that is attached by the magnetic lifting device. The effective thickness may be utilized to determine a cause for a load capacity of the magnetic lifting device indicated by a load capacity indicator. For example, an effective thickness smaller than a reference thickness may be utilized to determine that the attachment of the load is poor. On the other hand when the effective thickness is substantially the same with a reference thickness, an attachment of the load may be determined to have been achieved. Moreover, when the effective thickness is higher than a reference thickness, an attachment of the load may be determined to have been achieved; however, in this case, the effective thickness may be utilized to determine validity of the reference thickness. The reference thickness may be obtained from shipping documents, measured by the user and/or measured by a measurement instrument provided in the magnetic lifting device or by a measurement instrument provided separately from the magnetic lifting device. Examples of displaying the effective thickness and load capacity are provided by an effective thickness indicator 308, 408 and a load capacity indicator 310, 410 described with FIGS. 3 and 4.

Figure 2C:
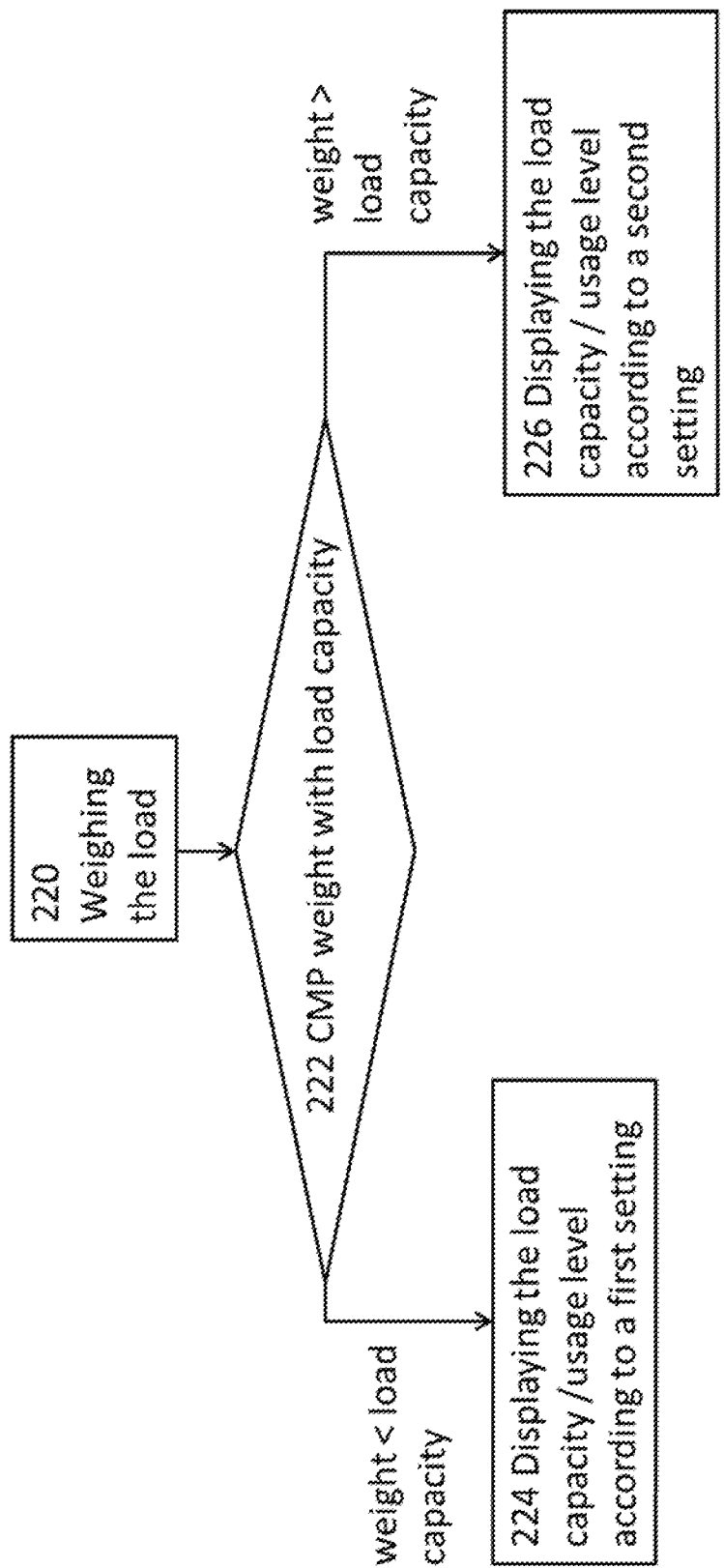

FIG. 2C illustrates a method for a magnetic lifting device in accordance with at least some embodiments of the present invention. The method may be performed by the magnetic lifting device described with FIG. 1. The method of FIG. 2C comprises at least phases 220 to 226. Phase 220 comprises determining a weight of the load. Phase 222 comprises comparing the determined weight with the load capacity. The load capacity may be determined in accordance with phase 208. If the weight is less than the load capacity, Phase 224 is performed. Phase 224 comprises displaying the load capacity and/or a usage level of the load capacity according to a first setting. If the weight is more or equal to the load capacity, phase 226 is performed. Phase 226 comprises displaying the load capacity and/or a usage level of the load capacity according to a second setting. In this way the user may obtain information of the load capacity of the magnetic lifting device specific to the load. Since the load capacity and/or the usage level of the load capacity is displayed by using different settings depending on the weight of the load, the user may obtain information regarding a relationship between the load capacity specific to the load and the weight. For example, in phase 224 the load capacity and/or the usage level of the load capacity may be displayed using a green or blue colour, whereas in phase 226 the load capacity may be displayed using a red or yellow color. Since the load capacity and/or the usage level of the load capacity is displayed using a different color scheme depending on the weight of the load, the user can easily understand the load capacity and/or the usage level of the load capacity of the magnetic lifting device. In this way lifting a load that can be a potential risk to safety may be avoided.

It should be appreciated that first setting and the second setting may each define a set of one or more settings that may be applied by the user interface for causing the load capacity and/or the usage level of the load capacity to be displayed in accordance with phases 224 and 226. The foregoing examples of the settings include colors but it should be appreciated that also other controllable settings of the user interface may be utilized for controlling how the load capacity and/or the usage level of the load capacity is displayed depending on the weight of the load.

Figure 3:
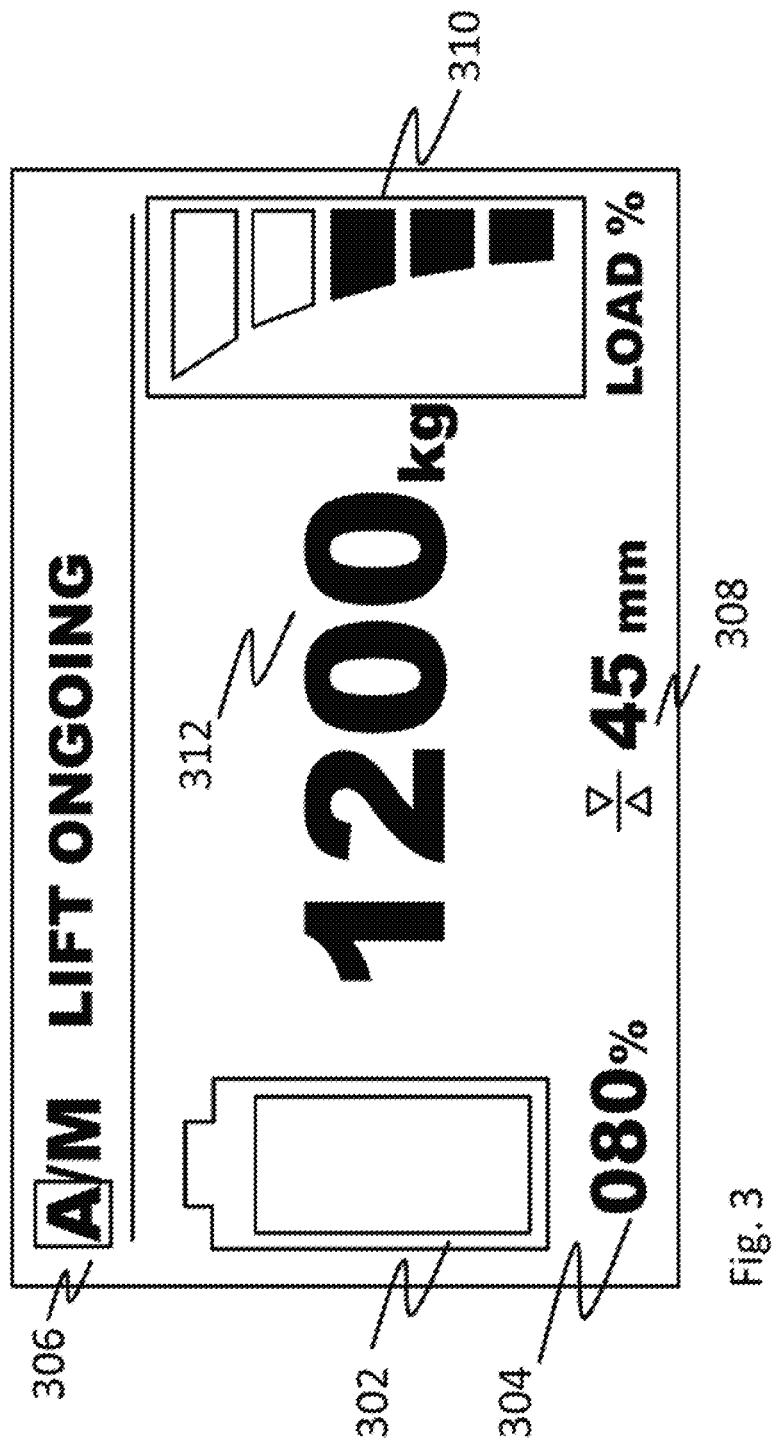
FIGS. 3 and 4 illustrate user interfaces for an apparatus in accordance with at least some embodiments of the present invention.
Figure 4:
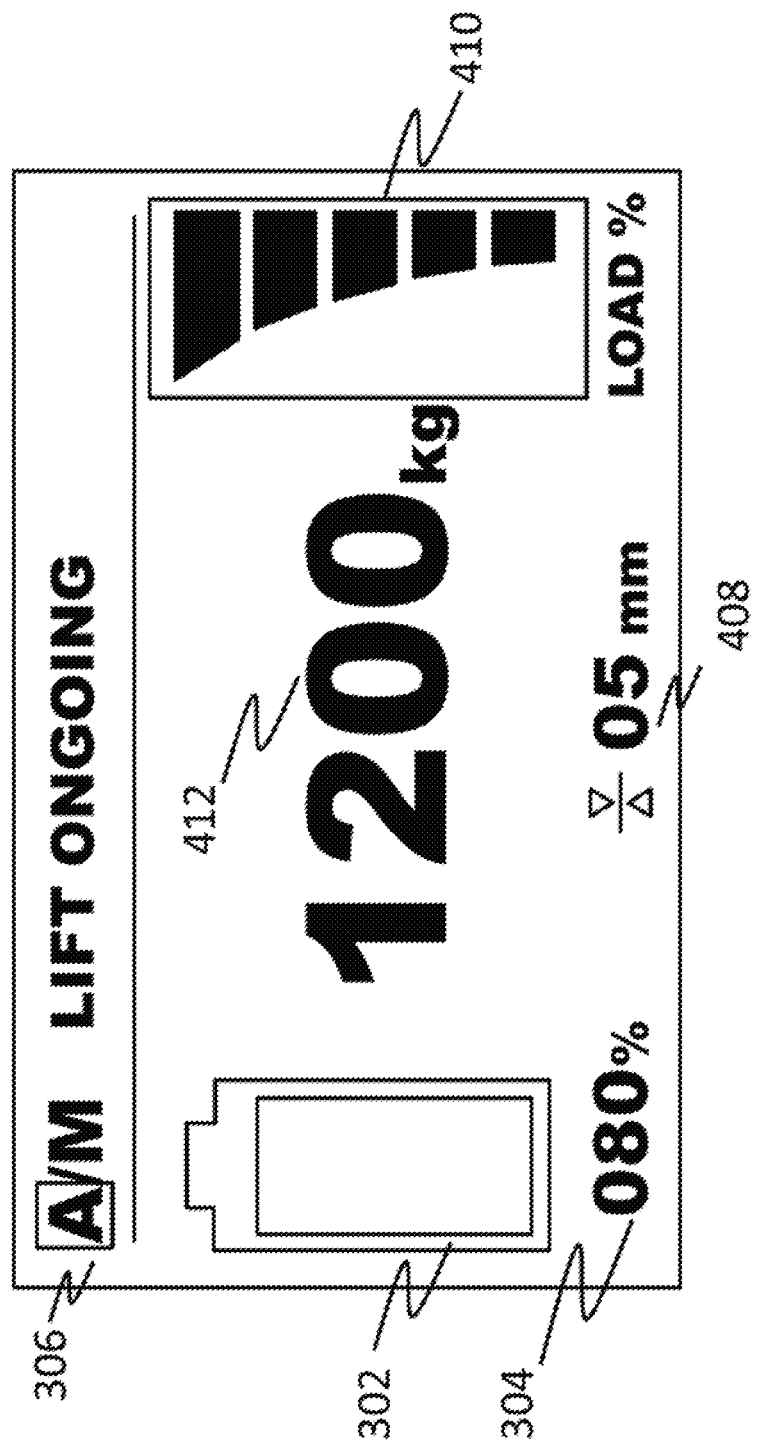

FIGS. 3 and 4 illustrate user interfaces for a magnetic lifting device in accordance with at least some embodiments of the present invention. The user interfaces illustrate scenarios, where a load is attached to a magnetic lifting device for example described with FIG. 1. When the load is attached to the magnetic lifting device, the load is within a magnetic field generated by an electromagnet and a magnetic force caused by the magnetic field maintains the load attached to the magnetic lifting device. The user interface may be utilized for example in phases 210, 218, 224 and 226 in FIGS. 2A, 2B and 2C for displaying information such as the load capacity the usage level of the load capacity and/or effective thickness, for facilitating safe use of the magnetic lifting device by the user.

Referring to FIGS. 3 and 4, a user interface may comprise one or more battery level indicators. A battery level indicator may be a graphical indicator 302 for indicating a charging level of a battery that is a direct current power source used in the magnetic lifting device. The graphical indicator may indicate for example a remaining charge of the battery. Alternatively or additionally the battery level indicator may be a numerical indicator 304 for indicating a charging level of the battery. The numerical indicator may be for example a charging level of the battery in percentages.

The user interface may comprise an operation mode indicator 306. The operation mode indicator may indicate, whether the magnetic lifting device is in an automatic operation mode or in a manual operation mode. In an example, the automatic operation mode may be indicated by highlighting letter 'A' displayed on the user interface. The highlighting is illustrated in FIG. 3 by a square around the letter 'A'.

The user interface may comprise an effective thickness indicator 308. The effective thickness indicator may serve for informing the user of an effective thickness of a load that is attached by the magnetic lifting device. The effective thickness of the load is a thickness determined based on the strength of the magnetic field that is created in the load. The effective thickness is a measure of magnetic field strength as a function of material thickness given for a reference material. For example, if the magnetized material is the same as the material used as reference and there is no air gap between the workpiece and magnet. Then, the effective thickness of the load may be the actual thickness of the workpiece. However, when a workpiece of enough thickness is placed under the magnet, the magnetic field is not saturated by the workpiece, but instead of the magnet itself. In such a case, the effective thickness may be the maximum value for the magnet in question.

The strength of the magnetic field that is created in the load may indicate a level of magnetization of the load. The level of magnetization of the load correlates with the actual thickness of the load when observed in the area of the electromagnet. The level of magnetization of the load may identify capability of the load to conduct a magnetic flux. The effective thickness may be an absolute value for example in [mm] of the thickness in a direction of the force caused by the magnetic field acting on the load. Alternatively or additionally, the effective thickness may be a proportional value in percentages of the actual thickness of the load. For example, when the effective thickness is the same as the actual thickness of the load, a level of magnetization may be high, for example 100%. However, when the level of magnetization of the load is lower, e.g. 50%, than a level of magnetization for a reference material, the effective thickness may be lower than the actual thickness of the load.

The user interface may comprise a load capacity indicator 310. The load capacity indicator may serve for displaying the load capacity proportional to a load capacity corresponding to an effective thickness of the load. The load capacity indicator may be a graphical indicator for indicating a load capacity of the magnetic lifting device and/or for indicating a usage level of the load capacity. Alternatively or additionally the load capacity indicator may be a numerical indicator for the load capacity and/or for a usage level of the load capacity. The usage level of load capacity may indicate a proportion of load capacity used, when a load is attached to the magnetic lifting device. The usage level may be determined based on a relationship of the weight of the load and the load capacity. The numerical indicator may indicate for example a portion of the load capacity of the magnetic lifting device that is currently used, when the load is attached to the magnetic lifting device. In FIG. 3 the load capacity indicator indicates that a part of the load capacity of the magnetic lifting device is used. The load capacity indicator in FIG. 3 comprises a bar having five parts, of which the black parts indicate the load capacity that is currently used.

The user interface may comprise a weight indicator 312 for displaying a weight of the load. The weight of the load may be measured by a scale operatively connected to the controller in the magnetic lifting device. The weight may be indicated by a numerical value for example in [kg].

FIG. 4 illustrates a user interface similar to the user interface of FIG. 3. The user interfaces of FIGS. 3 and 4 may be of the same magnetic lifting device, with the difference that the user interfaces illustrate scenarios having different load capacities. Accordingly, as a difference to FIG. 3, in FIG. 4 the user interface comprises a load capacity indicator 410 indicating that all of the load capacity of the magnetic lifting device is currently used. Accordingly, the load capacity indicator 410 comprises a bar having five parts, similar to FIG. 3, but since all the load capacity is currently used, all the parts of the bar are black. In an example implementation, the parts of the bar may be red or other suitable color indicating alert, if load capacity is exceeded, and if load capacity is not exceeded, the parts of the bar may be red or other less alerting color. Moreover, since all of the load capacity of the magnetic lifting device is currently used, the user interface may comprise a weight indicator 412 that comprises the load capacity of the magnetic lifting device. In this way the user may be provided information of the maximum load capacity of the magnetic lifting device specific to the load that is attempted to be attached to the magnetic lifting device. The information can be used by the user to change the load to another that should be within the load capacity. The user can alternatively or additionally clean contact surfaces of the magnetic lifting device and the load to improve the load capacity for a retry to attach to the load. Furthermore, the weight indicator may comprise the load capacity at least, when the magnetic lifting device is provided without a scale such that a measured weight of the load is not available. It should be appreciated that the weight indicator may be highlighted with a color determined according to the indicated information, for example actual weight of the load or the load capacity. When the weight indicator is indicating the actual weight of the load, the weight indicator may be blue or green. On the other hand, when the weight indicator is indicating the load capacity, the weight indicator may be red.

The user interface may comprise an effective thickness indicator 408 indicating a smaller thickness than the effective thickness indicator 308. The effective thickness indicated by the effective thickness indicator may be utilized to determine a cause for a load capacity of the magnetic lifting device indicated by the load capacity indicator. For example, an effective thickness smaller than a reference thickness, e.g. the thickness indicated by the effective thickness indicator 408, may be utilized to determine that the attachment of the load is poor. On the other hand when the effective thickness is substantially the same with the reference thickness, an attachment of the load may be determined to have been achieved. Moreover, when the effective thickness is higher than the reference thickness, an attachment of the load may be determined to have been achieved; however, in this case, the effective thickness may be utilized to determine validity of the reference thickness. The reference thickness may be obtained from shipping documents, measured by the user and/or measured by a measurement instrument provided in the magnetic lifting device or by a measurement instrument provided separately from the magnetic lifting device. Moreover, an effective thickness, for example the effective thickness 308, of a load that has been lifted previously by the magnetic lifting device may be used for the reference thickness.

It should be appreciated that displaying of the indicators described with FIGS. 3 and 4 on the user interface may be controlled by one or more sets of settings. Each indicator may be controlled by a set of indicator-specific settings or a set of settings may control two or more indicators. In an example, in addition to controlling how the load capacity is displayed based on weight of the load in accordance with the method of FIG. 2C, appearance of one or more of the other indicators described with FIGS. 3 and 4 may be changed based on the weight using either settings that are included in the settings for controlling how the load capacity is displayed or a set of separate settings.

It should be appreciated that in various embodiments herein attaching the magnetic lifting device to the load is performed when there is sufficient load capacity to attach to the load. Accordingly, if the load is too heavy and the load capacity is exceeded, the user may be notified by the user interface that the load capacity is exceeded and the lifting is not safe.

FIG. 5 illustrates a load capacity as a function of thickness in accordance with at least some embodiments of the present invention. The load capacity 502 may be a nominal load capacity of a magnetic lifting device described with FIG. 1. In FIG. 5 the load capacity for different thicknesses 504 of load, in this example, a plate, is given. The nominal load capacity may be provided, when a current of a coil in the magnetic lifting device has risen to a nominal value, whereby the electromagnet generates a magnetic field for attaching a load to the magnetic lifting device by a magnetic force caused by the magnetic field. A rise time of the current to the nominal value may correspond to a specific thickness of the load. An effective thickness, of the load may be determined to be the thickness 504 corresponding to the rise time of the current, when the load is within the magnetic field of the coil. Preferably, the load is in contact with the coil such that magnetization of the load by the magnetic field of the coil is efficient. It should be appreciated that the effective thickness may be different than the actual thickness of the load for various reasons that include but are not limited to: size of air gap between the load and the magnetic lifting device, irregularities in thickness and impurities between contacting surfaces of the load and the magnetic lifting device.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

INDUSTRIAL APPLICABILITY

Embodiments described herein are applicable at least in magnetic lifting devices, machine tools, magnetic workholding systems, magnetic chucks, magnetic vises and magnetic workholding tables for attaching to a load having a positive magnetic susceptibility.

ACRONYMS LIST

CMD Current measurement device
CPU Central processing unit
CRT Cathode ray tube display
ELD Electroluminescent display
LCD Liquid crystal display
LED Light-emitting diode display
MCU Microcontroller unit
PDP Plasma display panel
SWD Switching device
UI User Interface

REFERENCE SIGNS LIST

102 Magnetic lifting device in FIG. 1
104 Definition in FIG. 1
106 Controller in FIG. 1
108 Coil in FIG. 1
110 User interface in FIG. 1
112 Current measurement device in FIG. 1
114 Attachment piece in FIG. 1
115 Scale in FIG. 1
202 to 210 Phases of the method of FIG. 2A
212 to 218 Phases of the method of FIG. 2B
220 to 226 Phases of the method of FIG. 2C
302 Graphical indicator for indicating a charging level in FIG. 3
304 Numerical indicator for indicating a charging level in FIG. 3
306 Operation mode indicator in FIG. 3
308 Effective thickness indicator in FIG. 3
310 Load capacity indicator in FIG. 3
312 Weight indicator in FIG. 3
408 Effective thickness indicator in FIG. 4
410 Load capacity indicator in FIG. 4
412 Weight indicator in FIG. 4
502 Load capacity in FIG. 5
504 Thickness in FIG. 5

The invention claimed is:

1. An apparatus for magnetically attaching to a load, comprising:
   a direct current power source;
   an electromagnet comprising a coil connectable to the direct current power source for feeding current to the coil for attaching to the load by a magnetic force; a current measurement device connected to the coil;
   a user interface for displaying information indicating a load capacity of the apparatus; and
   a controller operatively connected to the direct current power source, the coil, the current measurement device and the user interface, the controller configured to cause:
   connecting the direct current power source to the coil;
   measuring current of the coil;
   determining a rise time of the current to a nominal value of current of the coil, when the load is attached to the apparatus;
   determining a load capacity of the apparatus based on the rise time of the current to the nominal value; and
   displaying the load capacity and/or a usage level of the load capacity on the user interface.

2. The apparatus according to claim 1, wherein the apparatus is configured to:
   determining an effective thickness of the load based on the rise time of the current indicating a level of magnetization of the load.

3. The apparatus according to claim 2, wherein the effective thickness is displayed by the user interface.

4. The apparatus according to claim 2, wherein the magnetic lifting device is configured to:
   determining the load capacity of the magnetic lifting device to be a nominal load capacity corresponding to the effective thickness of the load.

5. The apparatus according to claim 1, wherein the magnetic lifting device is configured to:
   displaying the load capacity proportional to a load capacity corresponding to an effective thickness of the load.

6. The apparatus according to claim 1, further comprising a scale connected to the controller, and the magnetic lifting device is is configured to:
   displaying the load capacity and/or the usage level of the load capacity according to a first setting, when a weight of the load is less than the load capacity, and
   displaying the load capacity and/or the usage level of the load capacity according to a second setting, when the weight of the load is more than the load capacity.

7. The apparatus according to claim 1, wherein the magnetic lifting device comprises a scale and a weight of the load measured by the scale is displayed on the user interface.

8. A method for an apparatus for magnetically attaching to a load comprising:
   a direct current power source;
   an electromagnet comprising a coil connectable to the direct current power source for feeding current to the coil for attaching to a load by a magnetic force;
   a current measurement device connected to the coil; and
   a user interface for displaying information indicating a load capacity of the apparatus, the method further comprising:
   connecting the direct current power source to the coil;
   measuring current of the coil;
   determining a rise time of the current to a nominal value of current of the coil, when the load is attached to the apparatus;

determining a load capacity of the apparatus based on the rise time of the current to the nominal value; and displaying the load capacity and/or a usage level of the load capacity on the user interface.

9. The method according to claim 8, further comprising:
determining an effective thickness of the load based on the rise time of the current indicating a level of magnetization of the load.

10. The method according to claim 9, further comprising:
displaying the effective thickness by in the user interface.

11. The method according to claim 9, further comprising:
determining the load capacity of the apparatus for the load to be a nominal load capacity corresponding to the effective thickness of the load.

12. The method according to claim 8, further comprising:
displaying the load capacity proportional to a load capacity corresponding to an effective thickness of the load.

13. The method according to claim 8, further comprising:
displaying at least one of the load capacity or the usage level of the load capacity according to a first setting, when a weight of the load is less than the load capacity, and displaying at least one of the load capacity or the usage level of the load capacity according to a second setting, when the weight of the load is more than the load capacity.

14. The method according to claim 8, further comprising:
measuring a weight of the load; and displaying the weight of the load on the user interface.

15. A computer program stored in a non-transitory computer readable medium to cause a method for an apparatus for magnetically attaching to a load to be performed when the computer program is executed by a controller operatively connected to the direct current power source, the coil, the current measurement device and the user interface, the method comprising:

a direct current power source;

an electromagnet comprising a coil connectable to the direct current power source for feeding current to the coil for attaching to a load by a magnetic force;

a current measurement device connected to the coil; and a user interface for displaying information indicating a load capacity of the apparatus, the method further comprising:

connecting the direct current power source to the coil;

measuring current of the coil;

determining a rise time of the current to a nominal value of current of the coil, when the load is attached to the apparatus;

determining a load capacity of the apparatus based on the rise time of the current to the nominal value; and displaying the load capacity and/or a usage level of the load capacity on the user interface.

* * * * *